(12) United States Patent  
Chamorro et al.

(10) Patent No.: US 10,012,403 B2
(45) Date of Patent: Jul. 3, 2018

(54) WIRING CONNECTOR HOUSING

(75) Inventors: Carlos O. Chamorro, City of Plano, TX (US); Randall L. Lisbona, City of Coppell, TX (US); Rick A. Mauk, City of Lewisville, TX (US)

(73) Assignee: Lennox Industries Inc., Richardson, TX (US)

( * ) Notice: Subject to any disclaimer, the term of this patent is extended or adjusted under 35 U.S.C. 154(b) by 2544 days.

(21) Appl. No.: 12/694,447

(22) Filed: Jan. 27, 2010

(65) Prior Publication Data

US 2010/0294845 A1 Nov. 25, 2010

Related U.S. Application Data

(60) Provisional application No. 61/180,405, filed on May 21, 2009.

(51) Int. Cl.
*F24F 7/00* (2006.01)
*H01R 11/20* (2006.01)
(Continued)

(52) U.S. Cl.
CPC ........ *F24F 11/0009* (2013.01); *F24F 11/006* (2013.01); *G01D 4/00* (2013.01);
(Continued)

(58) Field of Classification Search
CPC ............. G05D 23/1393; H01R 13/6456; F24F 11/0009
(Continued)

(56) References Cited

U.S. PATENT DOCUMENTS 3,184,707 A 5/1965 Anderson
4,174,144 A 11/1979 Le Helloco
(Continued)

FOREIGN PATENT DOCUMENTS

CN 1233864 A 11/1999
CN 1629556 A 6/2005
(Continued)

OTHER PUBLICATIONS

Translation of Chinese office action dated Jun. 5, 2014, Applicant: Lennox Industries Inc., 9 pages.
(Continued)

*Primary Examiner* — Frantz Jules
*Assistant Examiner* — Daniel C Comings
(74) *Attorney, Agent, or Firm* — Hubbard Johnston, PLLC

(57) ABSTRACT

A wiring connector housing including a housing body having first and second ends and at least one interference tab extending outwardly from the second end is provided. The wiring connector housing further comprises spaced apart channels located through the housing body extending from the first end to the second end with the first end of the channels each configured to receive a quick connector therein. Each of the second ends of the spaced apart channels being located to register with and receive corresponding quick connect terminals therein. The at least one interference tab is configured to contact an isolation ridge of an electrical relay and thereby prevent the second ends of the spaced apart channels from being improperly registered with the corresponding quick connect terminals.

24 Claims, 6 Drawing Sheets

(51) Int. Cl.
- H01R 13/648 (2006.01)
- H01R 24/00 (2011.01)
- F24F 11/00 (2018.01)
- G05B 13/02 (2006.01)
- G05B 13/00 (2006.01)
- G01R 21/133 (2006.01)
- G06Q 50/06 (2012.01)
- G01D 4/00 (2006.01)
- G01R 21/127 (2006.01)
- G01R 21/00 (2006.01)
- H02P 25/04 (2006.01)
- H01R 13/645 (2006.01)
- H01R 12/50 (2011.01)
- G05B 19/042 (2006.01)
- G05D 23/13 (2006.01)
- G05B 15/02 (2006.01)
- H04L 12/24 (2006.01)
- H02J 3/14 (2006.01)

(52) U.S. Cl.
CPC ........... *G01R 21/00* (2013.01); *G01R 21/127* (2013.01); *G01R 21/133* (2013.01); *G01R 21/1335* (2013.01); *G05B 13/00* (2013.01); *G05B 13/02* (2013.01); *G05B 15/02* (2013.01); *G05B 19/042* (2013.01); *G05D 23/1393* (2013.01); *G06Q 50/06* (2013.01); *H01R 13/6456* (2013.01); *H01R 23/7073* (2013.01); *H02P 25/04* (2013.01); *H04L 41/082* (2013.01); *F24F 2011/0071* (2013.01); *G05B 2219/2614* (2013.01); *H02J 2003/143* (2013.01); *H02J 2003/146* (2013.01); *Y02B 70/3216* (2013.01); *Y02B 70/3225* (2013.01); *Y02B 70/3233* (2013.01); *Y02B 70/3241* (2013.01); *Y02B 70/3275* (2013.01); *Y02P 80/114* (2015.11); *Y04S 20/221* (2013.01); *Y04S 20/222* (2013.01); *Y04S 20/224* (2013.01); *Y10T 29/49* (2015.01); *Y10T 29/4935* (2015.01); *Y10T 29/49117* (2015.01); *Y10T 29/49147* (2015.01); *Y10T 29/49359* (2015.01); *Y10T 29/49826* (2015.01); *Y10T 307/713* (2015.04)

(58) Field of Classification Search
USPC ........... 236/49.3; 439/676, 607.01, 535, 537, 439/441; 326/49.3
See application file for complete search history.

(56) References Cited

U.S. PATENT DOCUMENTS 4,787,212 A * 11/1988 Hessey ............................ 62/188
6,296,523 B1 10/2001 Sasai
6,976,870 B1 * 12/2005 Li ............................... 439/541.5

FOREIGN PATENT DOCUMENTS

| DE | 4420984 A1 | 12/1995 |
| DE | 202008014441 U1 | 12/2008 |
| DE | 202008014441 U1 | 1/2009 |
| EP | 0954064 A2 | 11/1999 |

OTHER PUBLICATIONS

Examination Report received in Australian Patent Application No. 2010227043, dated Nov. 25, 2015, 4 pages.
Examination Report received in Canadian Patent Application No. 2,716,313, dated Jul. 26, 2016, 6 pages.
Examination Report received in Canadian Patent Application No. 2,716,313, dated Apr. 28, 2017, 6 pages.
Office Action received in European Patent Application No. 10188810.5, dated Mar. 2, 2015, 7 pages.
Office Action received in European Patent Application No. 10188810.5, dated Sep. 30, 2015, 6 pages.

* cited by examiner

WIRING CONNECTOR HOUSING

CROSS-REFERENCE TO RELATED APPLICATION

This application claims the benefit of U.S. Provisional Application Ser. No. 61/180,405, filed by Mark Beste, et al., on May 21, 2009, entitled "Comprehensive HVAC Control System," and incorporated herein by reference in its entirety.

TECHNICAL FIELD

This application is directed, in general, to an air conditioning system and, more specifically, to a wiring connection system for "ice cube" relays.

BACKGROUND

Current air conditioning (HVAC) systems employ multi-pole relays encased in clear polycarbonate and resembling an oversize ice cube; thus the common name "ice cube" relays. The relays are typically mounted to the chassis or a board and have up to 11 single point connections configured with 0.25"×0.032" male quick disconnect wiring terminals. As all of the terminals on the multi-pole relay are physically the same, i.e., male quick disconnect type, and the wires to be connected to the relay are all terminated with the same size female quick disconnects, this leads to the possibility of incorrect connection of the wires to the relay terminals during manufacturing, assembly and troubleshooting.

For example, the relays in question may have up to three poles with double throw and nine connectors to the internal relays with an additional two connectors for coil voltage. Thus, with 11 terminals and 11 wiring leads there are 11! (eleven factorial) ways to connect the wiring leads to the terminals. This can lead to errors in servicing the unit, which in turn can lead to a malfunction in the operation of the unit.

SUMMARY

One aspect provides a wiring connector housing comprising a housing body having first and second ends and at least one interference tab extending outwardly from the second end. The wiring connector housing further comprises spaced apart channels located through the housing body extending from the first end to the second end with the first end of the channels each configured to receive a quick connector therein. Each of the second ends of the spaced apart channels are located to register with and receive corresponding quick connect terminals therein. The at least one interference tab is configured to contact an isolation ridge of an electrical relay and thereby prevent the second ends of the spaced apart channels from being improperly registered with the corresponding quick connect terminals.

In another aspect, there is provided a method of manufacturing a wiring connector housing comprising forming a housing body having first and second ends and forming at least one interference tab extending outwardly from the second end. Spaced apart channels are formed through the housing body and extend from the first end to the second end. The first ends of the channels are each configured to receive a quick connector therein. Each of the second ends of the spaced apart channels are formed to register with and receive corresponding quick connect terminals therein. The interference tab is configured to contact an isolation ridge of an electrical relay and thereby prevent the second ends of the spaced apart channels from being improperly registered with the corresponding quick connect terminals.

In yet another aspect, there is provided an air conditioning system comprising an air handler, a controller, a chassis having an electrical relay mounted thereon, and a wiring connector housing having first and second ends and spaced apart channels therethrough. The electrical relay has at least one isolation ridge and terminals thereon. Each of the spaced apart channels is configured to receive a quick connector through the first end. An interference tab extends outwardly from the second end and is positioned such that the interference tab contacts the isolation ridge when the housing body is incorrectly aligned with the terminals. The quick connectors are thereby prevented from contacting one of the terminals.

BRIEF DESCRIPTION

Reference is now made to the following descriptions taken in conjunction with the accompanying drawings, in which.

DETAILED DESCRIPTION

Figure 1:
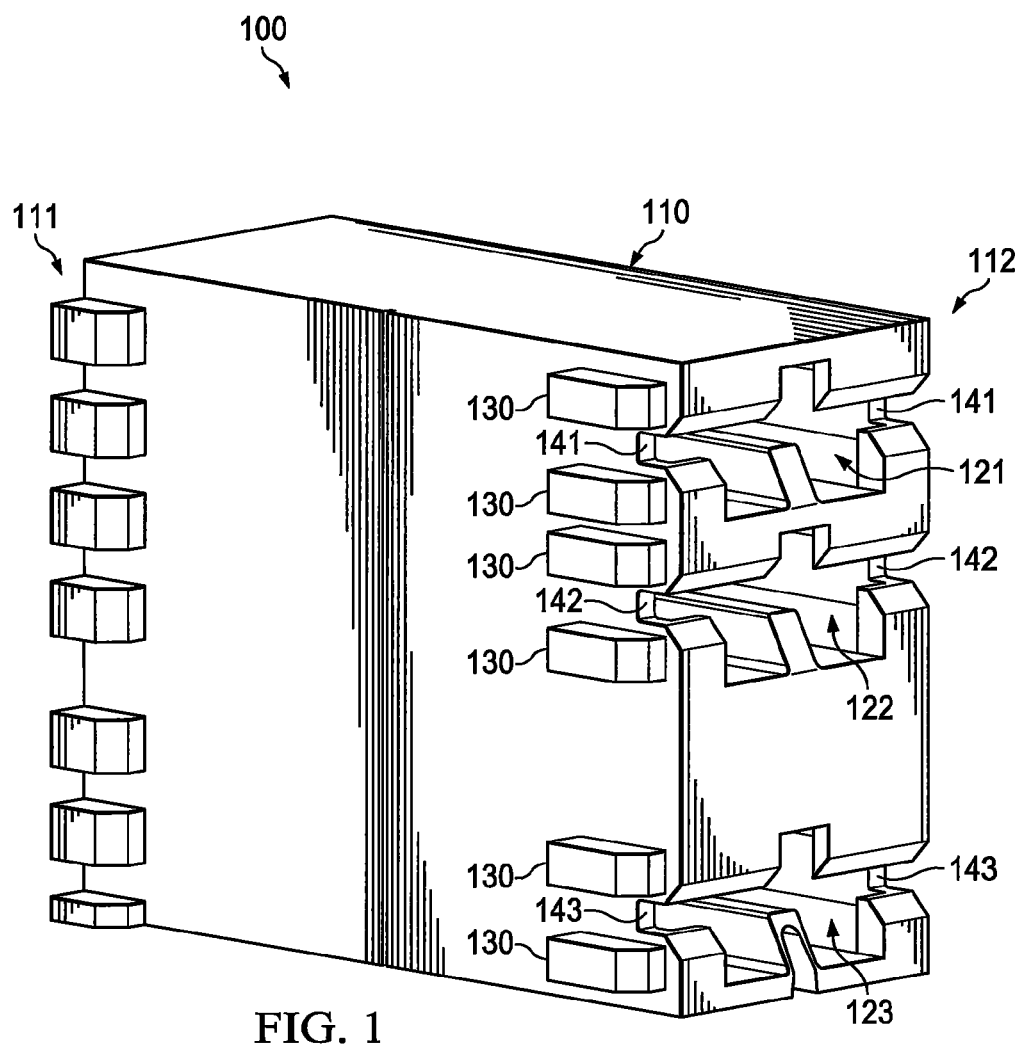
FIG. 1 is a perspective view of one embodiment of a wiring connector housing.

Referring initially to FIG. 1, illustrated is a perspective view of one embodiment of a wiring connector housing 100 constructed according to the principles discussed herein. As explained below, the wiring connector housing 100 is designed to receive and retain a quick connector therein that is often used to make connection to electrical components, such as a relay, that have one or more corresponding male terminals located thereon. In many HVAC applications, various components have to be electrically connected or serviced in the field. In such instances, the service technician must make the appropriate connections when either assembling the HVAC system or servicing an in-place unit. Often in rooftop units, the wiring schemes can be very complicated, which increases the chance of a wrong electrical connection being made. The wiring connector housing 100 is designed to reduce the number of erroneous connections being made during installation or servicing.

The wiring connector housing 100 comprises a housing body 110, spaced apart channels 121, 122, 123, interference tabs 130, and terminal registration slots 141, 142, 143. The housing body 110 has first and second ends 111, 112, respectively. In this embodiment, the interference tabs 130 are a plurality of tabs extending outwardly from a side of the housing body 110 at the second end 112 that will prevent the connection of the wiring connector housing 100 to an electrical component having quick connect male terminals or tabs thereon, if not correctly aligned with those male tabs. However, in other embodiments, the interference tab may be a single tab that extends along a portion of the side of the housing 110. The wiring connector housing 100 may be manufactured from suitable plastic materials using an injection molding process.

Figure 2:
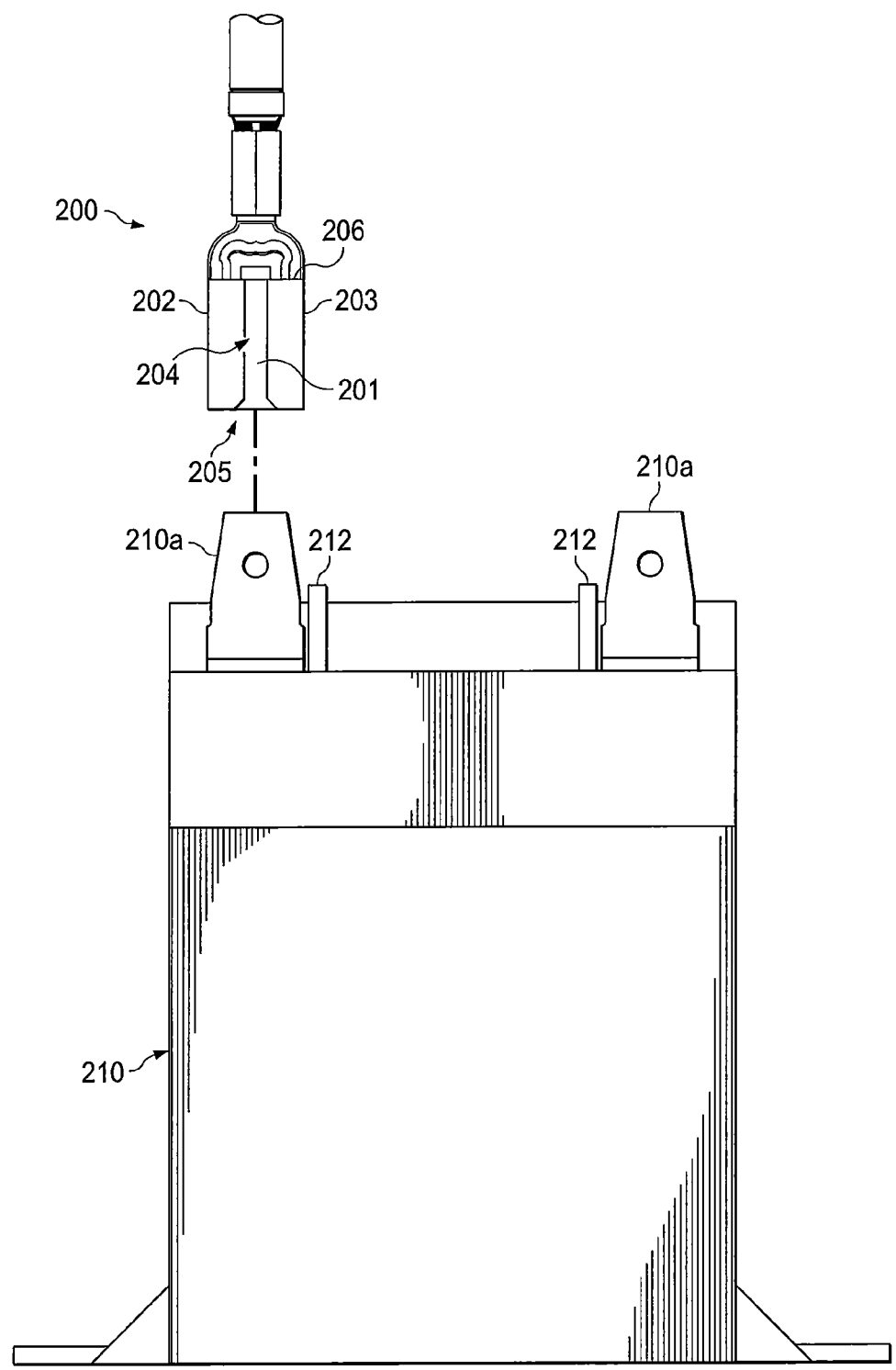
FIG. 2 is an elevation view of a conventional female quick connector and a conventional male quick connector tab located on a relay on which the quick connector may be placed.

FIG. 2 illustrates a conventional quick connector 200 and a conventional relay 210 that includes male quick connector tabs 210a, which are often used in HVAC applications. In one embodiment, the quick connector 200 may include a flat portion 201 with sides 202, 203 that are bent around to near contact with an inside surface 204 of the flat portion 201. The quick connector 200 has a connecting end 205 that can receive one of the male connector tabs 210a. As explained below, the quick connector 200 is housed within one of the spaced apart channels 121, 122, 123 of the device of FIG. 1.

The conventional male quick connector tabs 210 are representative of male quick connector tabs as found on electrical equipment, such as electrical relays. One who is skilled in the art will readily recognize how the female quick connector 200 will removably couple to the male quick connector tabs 210a. Further, it should be understood that the relay 210 may have three or more male quick connector tabs 210a located on each side of the relay 210. In the illustrated embodiment, the relay 210 also includes opposing isolation ridges 212. As explained below, the isolation ridges 212 in cooperation with the interference tabs 130 prevent incorrect connection of the wiring connector housing 100 (FIG. 1) to the relay 210.

Figure 3:
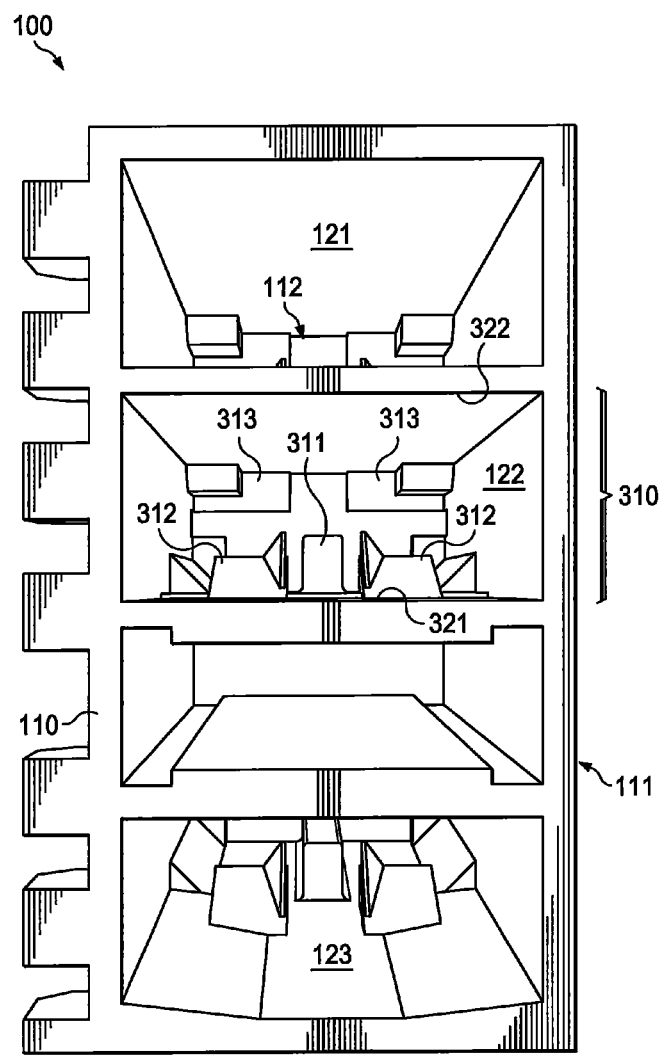

FIG. 3 illustrates the first end 111 of the wiring connector housing 100 of FIG. 1. In this view, it can be seen that the spaced apart channels 121-123 extend through the entire length of the housing body 110. The spaced apart channels 121-123 are configured to each receive the quick connector 200, discussed above. Each spaced apart channel has a quick connector securing device 310 therein proximate the second end 112. Each quick connector securing device 310 comprises a central guide ridge 311, two connector spring tabs 312, and a quick connector stop 313. The central guide ridge 311 and connector spring tabs 312 are located on a first wall 321 of the spaced apart channels 121-123, whereas the quick connector stop 313 is located on a second wall 322 opposite the first wall 321 at the second end 112 of each spaced apart channel 121-123.

Referring now to FIG. 2 with continuing reference to FIG. 3. The central guide ridge 311 acts to center the quick connector 200 by fitting over the inside surface 204 and between the left and right sides 202, 203 as the quick connector 200 is inserted into a one of the spaced apart channels 121-123. As the quick connector 200 is inserted into the first end 111, the quick connector spring tabs 312 are depressed slightly by the left and right sides 202, 203 of the quick connector 200 until the connecting end 205 of the quick connector 200 touches the quick connector stops 313 and the quick connector spring tabs 312 slip in behind ends 206 of the left and right sides 202, 203 of the quick connector 200, thereby securely locking the quick connector 200 in place within the wiring connector housing 100. This prevents a service technician from removing a wire and connector from the wiring connector housing 100 and incorrectly re-inserting the connector in the wrong location. Therefore, once the wiring harness is equipped with the appropriate wiring connector housing 100, the wiring harness cannot be easily changed.

Figure 4:
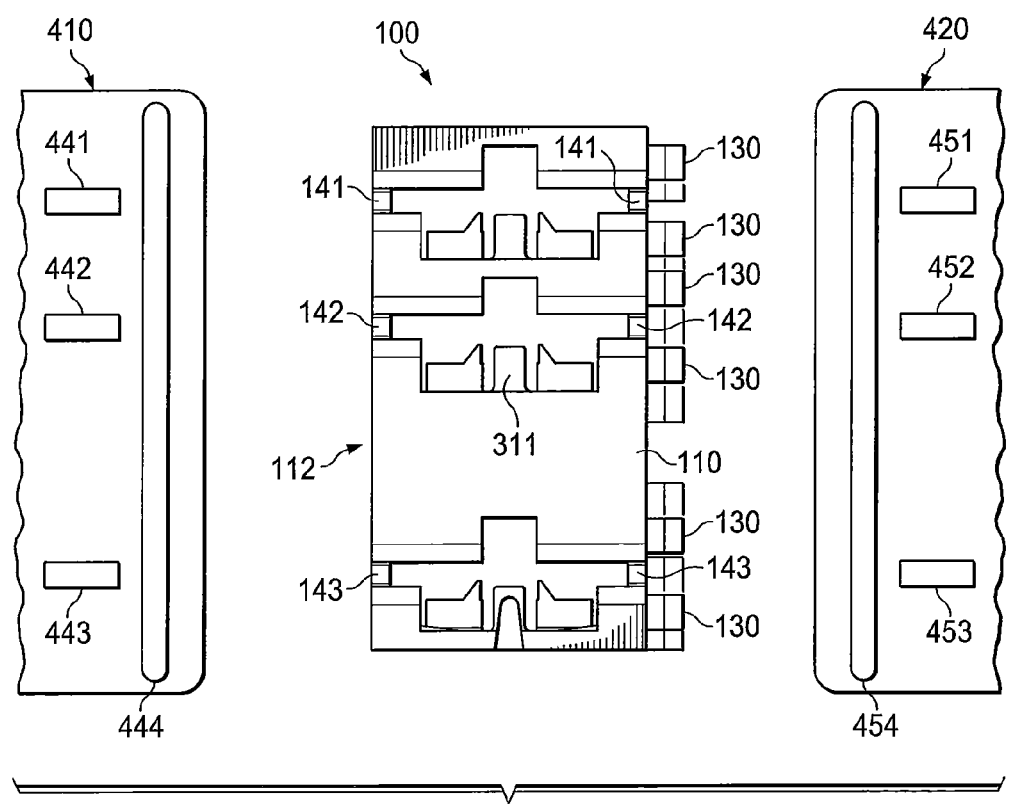
FIG. 4 is a perspective view of the second end of the wiring connector housing of FIG. 1.

FIG. 4 illustrates a perspective view of the second end 112 of the wiring connector housing 100 of FIG. 1. To the left and right of the wiring connector housing 100 are partial views of two male connector layouts 410, 420, respectively, as may be found on a typical electrical HVAC component. The left and right male connector layouts 410, 420 have male connectors 441-443 and 451-453, respectively, extending therefrom in patterns that align with the terminal registration slots 141-143 insofar as spacing is concerned. The left and right male connector layouts 410, 420 have isolation ridges 444, 454, respectively.

In the following discussion, it must be remembered that the wiring connector housing 100 must be inverted to enable it to be placed on the connector layouts 410, 420 because of the spacing relationship of the male connectors 441-443 and 451-453 and the terminal registration slots 141-143. Therefore, if a technician attempts to place the wiring connector housing 100 on the right male connector layout 420, which in this case is the wrong connector, the interference tabs 130 will contact the isolation bar 454; and the technician will not be able to properly seat the wiring connector housing 100 on the male connector layout 420. Thus, incorrect electrical contact will be prevented from occurring. However, if the technician places the wiring connector housing 100 on the left male connector layout 410, which in this case are the correct components, the interference tabs 130 will be located on the outside edge (indicated by straight lines) of the male connector layout 410, and the isolation bar 444 will not interfere with the proper seating of the wiring connector housing 100 onto the male connectors 441-443. Thus, correct electrical contact is made. Therefore, it should be understood that even though the spacing of the male and female connectors agree, the wiring connector housing 100 can only be placed upon the correct terminals because the interference tabs 130 will prevent proper seating on any incorrect terminals.

Figure 5:
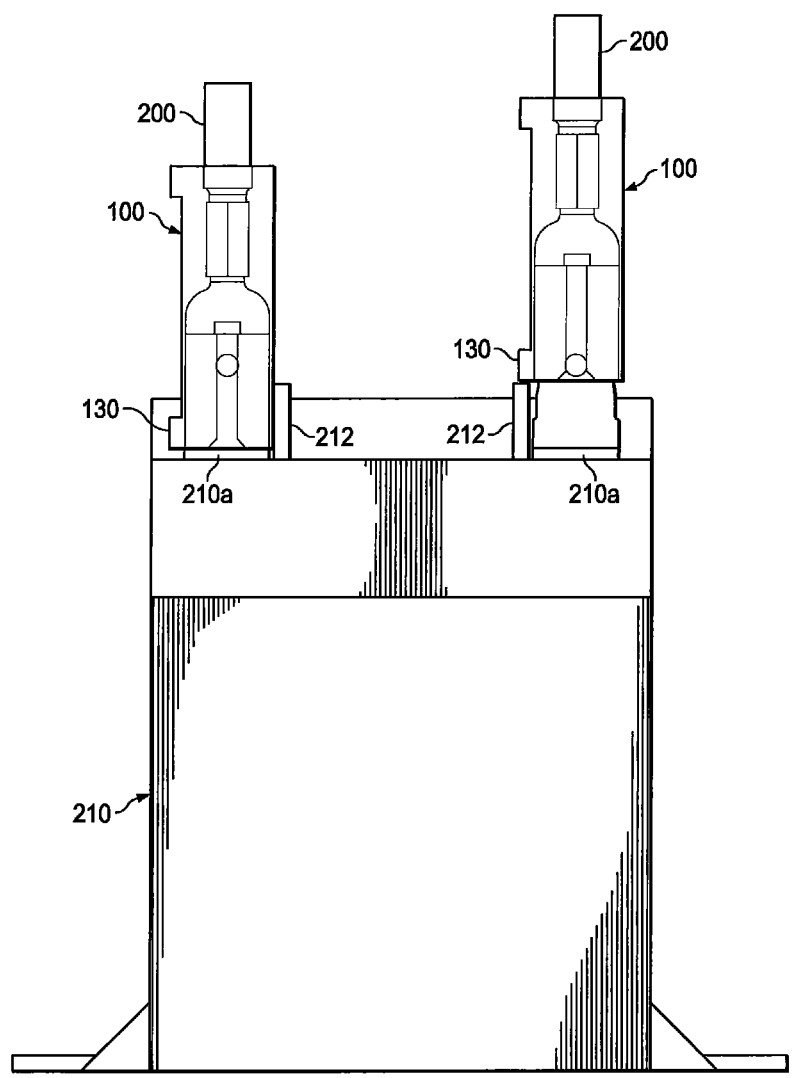
FIG. 5 illustrates a relay contrasting a correct positioning of a wiring connector housing with an incorrect positioning of the wiring connector housing.

FIG. 5 further illustrates the application of the wiring connector housing 100 from a different perspective. This view illustrates the application of how the wiring connector housing 100 can be seated onto the male connectors 210a when properly oriented (left side configuration) but cannot be seated when improperly oriented (right side configuration). As seen here, the wiring connector housings 100 have the female quick connectors 200 located therein that are configured to slip onto the male connectors 210a. In the right side of this view, it can be seen that, since the wiring connector housing 100 is improperly oriented, the interference tabs 130 contact the isolation bar 212, which prevents the wiring connector housing 100 from being fully seated on the male connector 210a. Thus, improper electrical connection is prevented and will be readily apparent to the technician. In contrast, the left side of this view illustrates the wiring connector housing 100 properly oriented such that the interference tabs 130 extend outwardly from the side of the housing body 110 at the outside edge of the component 210. As such, they do not contact an isolation bar 212, which allows the quick connector 200 to fully engage the male connector 210a on the left side of the component 210; thereby providing complete seating of the wiring connector housing 100 and proper electrical connection to be made.

Thus, a wiring connector housing 100 has been described that locks a plurality of female connectors within the housing in a pre-set order to correctly interface to a matching plurality of male connectors on an electrical device, e.g., an electrical relay. The housing is configured in such a manner that even if the spacing between male connectors and female connectors have the same pattern and spacing, the housing will only properly couple to the correct electrical contacts having an isolation bar thereon.

Figure 6:
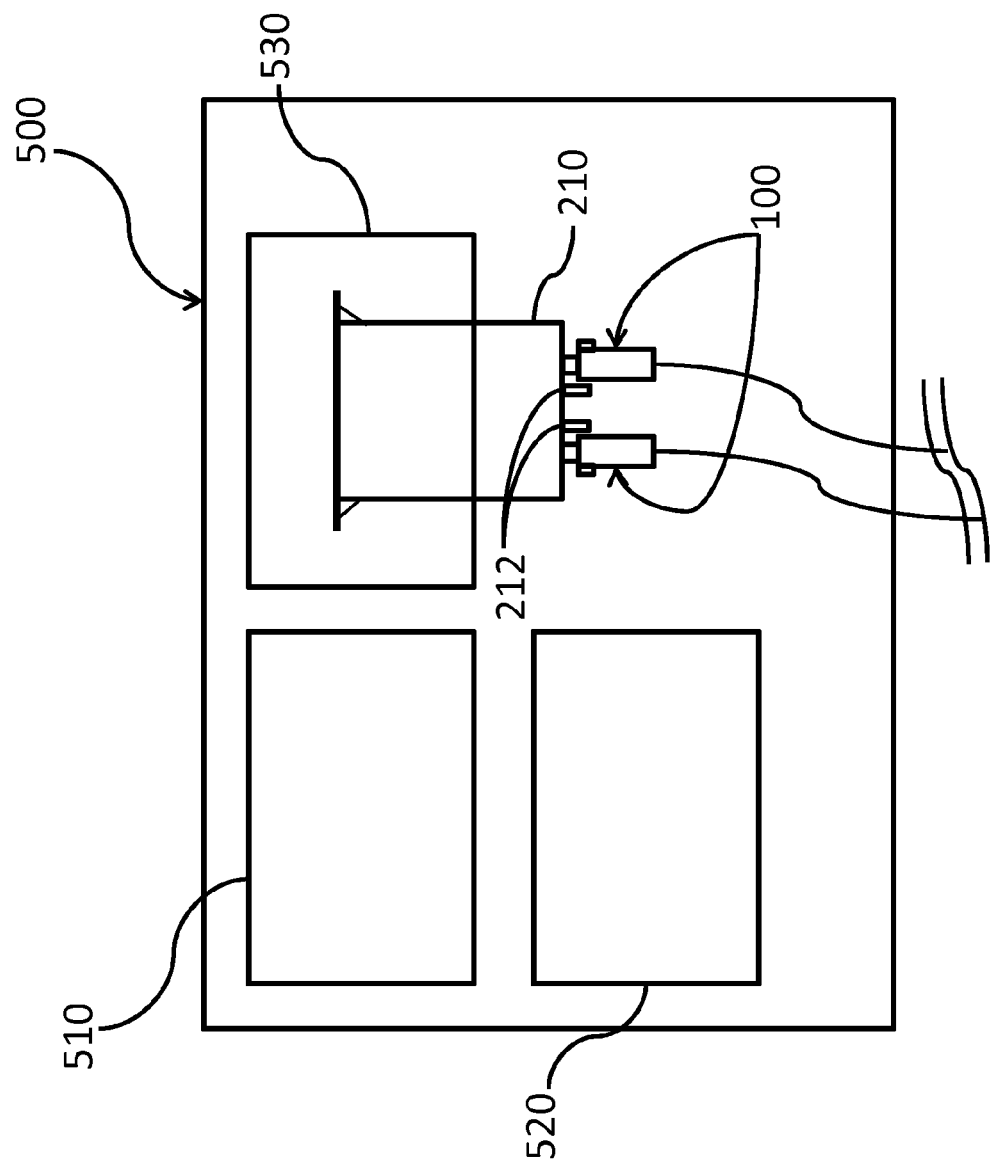
FIG. 6 illustrates an air conditioning system that includes one embodiment of a wiring connector housing.

FIG. 6 illustrates an air conditioning system 500 including the wiring connector housing 100 as previously described with FIGS. 1, 3 and 4. The air conditioning system 500 further includes an air handler 510, a controller 520 and a chassis 530 having an electrical relay 210, as previously described with FIG. 2, mounted thereon. The electrical relay 210 has at least one isolation ridge 212 and terminals thereon.

One who is of skill in the art can readily understand that the above described invention may be used with a variety of electrical relays such as are commonly used in air conditioning systems to control operation of the various system components.

Those skilled in the art to which this application relates will appreciate that other and further additions, deletions, substitutions and modifications May be made to the described embodiments.

What is claimed is:

1. A wiring connector housing, comprising:
    a housing body having first and second ends, opposing sides, each of which intersects said first and second ends and spaced apart channels located through said housing body and extending from said first end to said second end, each of said spaced apart channels being configured to receive a quick connector through said first end;
    each of said spaced apart channels being configured to register with and receive a corresponding quick connect terminal through said second end; and
    at least one interference tab extending outwardly from one of said sides proximate said second end, said at least one interference tab configured to contact an isolation ridge of an electrical relay and thereby prevent said second ends of said spaced apart channels from being improperly registered with said corresponding quick connect terminal.

2. The wiring connector housing as recited in claim 1 wherein each of said spaced apart channels comprises a quick connector securing device therein proximate said second end.

3. The wiring connector housing as recited in claim 2 wherein each of said securing devices comprise a central guide ridge on a first wall of each of said spaced apart channels.

4. The wiring connector housing as recited in claim 2 wherein each of said securing devices further comprise a connector spring tab on said first wall.

5. The wiring connector housing as recited in claim 2 wherein each of said securing devices further comprise a quick connector stop on an opposite second wall of said spaced apart channels at said second end.

6. The wiring connector housing as recited in claim 1 wherein said interference tab comprises a plurality of tabs.

7. The wiring connector housing as recited in claim 1 further comprising terminal registration slots at said second end of said spaced apart channels.

8. A method of manufacturing a wiring connector housing, comprising:
    forming a housing body having first and second ends, opposing sides, each of which intersects said first and second ends, and spaced apart channels located through said housing body and extending from said first end to said second end, each of said spaced apart channels being configured to receive a quick connector through said first end;
    forming each of said spaced apart channels to register with and receive a corresponding quick connect terminal through said second end; and
    forming at least one interference tab extending outwardly from one of said sides proximate said second end such that said interference tab contacts an isolation ridge of an electrical relay and thereby prevents said second ends of said spaced apart channels from being improperly registered with said corresponding quick connect terminal.

9. The method as recited in claim 8 further comprising forming a quick connector securing device in each of said spaced apart channels proximate said second end.

10. The method as recited in claim 9 wherein forming a quick connector securing device comprises forming a central guide ridge on a first wall of each of said spaced apart channels.

11. The method as recited in claim 9 wherein forming a quick connector securing device further comprises forming a connector spring tab on said first wall.

12. The method as recited in claim 9 wherein forming a quick connector securing device further comprises forming a quick connector stop on an opposite second wall of said spaced apart channels at said second end.

13. The method as recited in claim 8 wherein forming said interference tab comprises forming a plurality of tabs.

14. The method as recited in claim 8 wherein forming each of said second ends further comprises forming terminal registration slots at said second end of said spaced apart channels.

15. The method as recited in claim 9 wherein forming said quick connector securing device further comprises forming a quick connector stop on an opposite second wall of said spaced apart channels at said second end.

16. An air conditioning system, comprising:
    an air handler;
    a controller;
    a chassis having an electrical relay mounted thereon, said electrical relay having at least one isolation ridge and terminals thereon; and
    a wiring connector housing including:
        a housing body having first and second ends, opposing sides, each of which intersects said first and second ends, and a first through channel located through said housing body, said first through channel configured to receive a quick connector through said first end; and
        an interference tab extending outwardly from one of said sides proximate said second end and positioned such that said interference tab contacts said isolation ridge when said housing body is incorrectly aligned with said terminals, said quick connectors thereby prevented from contacting a one of said terminals.

17. The air conditioning system as recited in claim 16 wherein said housing body has a second through channel configured to receive a second quick connector through said first end.

18. The air conditioning system as recited in claim 17 wherein a first center of said first through channel and a second center of said second through channel are spaced apart in said housing body at a distance substantially equal to a distance between a first terminal and a second terminal of said electrical relay.

19. The air conditioning system as recited in claim 17 wherein said housing body has a third through channel configured to receive a third quick connector through said first end.

20. The air conditioning system as recited in claim 19 wherein a third center of said third through channel and said second center of said second through channel are spaced apart in said housing body at a distance substantially equal to a distance between said second terminal and a third terminal.

21. The air conditioning system as recited in claim 16 wherein said first through channel comprises a first quick connector securing device therein.

22. The air conditioning system as recited in claim 21 wherein said securing device comprises a central guide ridge on a first wall of said first through channel.

23. The air conditioning system as recited in claim 21 wherein said securing device further comprises a connector spring tab on said first wall.

24. The air conditioning system as recited in claim 21 wherein said securing device further comprises a quick connector stop on an opposite second wall of said first through channel at said second end.

* * * * *